United States Patent
Kunishi et al.

(10) Patent No.: US 8,448,313 B2
(45) Date of Patent: May 28, 2013

(54) METHOD FOR PRODUCING CERAMIC BODY

(75) Inventors: Tatsuo Kunishi, Nagaokakyo (JP);
Junichi Saito, Nagaokakyo (JP);
Yoshinori Ueda, Nagaokakyo (JP);
Akihiro Motoki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/167,751

(22) Filed: Jun. 24, 2011

(65) Prior Publication Data
US 2011/0252629 A1 Oct. 20, 2011

Related U.S. Application Data

(63) Continuation of application No. PCT/JP2009/005680, filed on Oct. 28, 2009.

(30) Foreign Application Priority Data

Dec. 25, 2008 (JP) ................................ 2008-330470

(51) Int. Cl.
*H01G 4/30* (2006.01)
(52) U.S. Cl.
USPC ...................... 29/25.42; 29/25.41; 361/321.2
(58) Field of Classification Search
USPC ........ 29/25.41–25.42, 592.1, 594; 361/301.4, 361/306.3, 309
See application file for complete search history.

(56) References Cited

U.S. PATENT DOCUMENTS

| 4,552,786 | A | 11/1985 | Berneburg et al. |
| 5,311,651 | A * | 5/1994 | Kim et al. .................... 29/25.42 |
| 6,194,650 | B1 | 2/2001 | Wakayama et al. |
| 6,545,857 | B2 * | 4/2003 | Kishimoto et al. ........ 361/321.2 |
| 7,020,941 | B2 * | 4/2006 | Chazono et al. ............. 29/25.41 |
| 7,500,397 | B2 * | 3/2009 | Weigel et al. .................... 73/714 |
| 2002/0057980 | A1 | 5/2002 | Morita et al. |
| 2008/0204974 | A1 | 8/2008 | Yoshimitsu |
| 2008/0239617 | A1 * | 10/2008 | Motoki et al. ............. 361/301.4 |

FOREIGN PATENT DOCUMENTS

| EP | 1 959 485 A2 | 8/2008 |
| JP | 61-91085 A | 5/1986 |
| JP | 02-301113 A | 12/1990 |
| JP | 04-061106 A | 2/1992 |
| JP | 10-208907 A | 8/1998 |
| JP | 11-340091 A | 12/1999 |

(Continued)

OTHER PUBLICATIONS

Official Communication issued in International Patent Application No. PCT/JP2009/005680, mailed on Feb. 2, 2010.

(Continued)

*Primary Examiner* — Minh Trinh
(74) *Attorney, Agent, or Firm* — Keating & Bennett, LLP

(57) ABSTRACT

Provided is a method for producing a ceramic body, which is capable of preventing the ingress of moisture into a void between a conductor and the ceramic body more effectively in the ceramic body including the conductor therein. Ingress of a supercritical fluid containing an oxide sol precursor is achieved into a void between an internal electrode layer and a ceramic laminate. After that, the oxide sol is turned into a gel, and subjected to a heat treatment, thereby filling the void between the internal electrode layer and the ceramic laminate with an oxide.

5 Claims, 1 Drawing Sheet

FOREIGN PATENT DOCUMENTS

| | | |
|---|---|---|
| JP | 2001-102247 A | 4/2001 |
| JP | 2002-234775 A | 8/2002 |
| JP | 2007-294361 A | 11/2007 |
| JP | 2008-199028 A | 8/2008 |
| JP | 2008-211063 A | 9/2008 |

OTHER PUBLICATIONS

Official Communication issued in corresponding Japanese Patent Application No. 2010-543770, mailed on Oct. 9, 2012.

* cited by examiner

METHOD FOR PRODUCING CERAMIC BODY

BACKGROUND OF THE INVENTION

1. Field of the Invention

The present invention generally relates to a method for producing a ceramic body, and more particularly, relates to, a method for producing, for example, a chip-type ceramic electronic component such as a laminated ceramic capacitor.

2. Description of the Related Art

Conventionally, a laminated ceramic capacitor as an example of a ceramic body is produced in the following way.

First, a slurry is prepared which contains a ceramic raw material powder. This slurry is formed into sheets to prepare ceramic green sheets. A conductive paste as a raw material for internal electrode layers is applied onto surfaces of the ceramic green sheets in accordance with a predetermined pattern. This conductive paste is constituted of a metal powder, a solvent, and a varnish.

Next, the multiple ceramic green sheets with the conductive paste applied thereto are stacked, and subjected to thermocompression bonding to prepare an integrated raw laminate. This raw laminate is subjected to firing to prepare a ceramic laminate. This ceramic laminate has a plurality of internal electrode layers formed therein. The internal electrode layers have certain end surfaces exposed at the external surface of the ceramic laminate.

Next, a conductive paste as a raw material for external electrode layers is applied onto the external surface of the ceramic laminate including the internal electrode layers with the certain end surfaces exposed, and subjected to firing. This conductive paste is constituted of a metal powder, a glass frit, a solvent, and a varnish. Thus, external electrode layers are formed on the external surface of the ceramic laminate, so as to be electrically connected to specific internal electrode layers.

Finally, in order to improve soldering performance, a plating layer is formed on the surfaces of the external electrode layers, if necessary.

During the production process described above, for example, in the case of forming a plating layer on the surfaces of the external electrode layers, ingress of moisture is caused from minute voids which are present in the external electrode layers. In addition, in the case of using a laminated ceramic capacitor as an example of the ceramic body under a high humidity environment, ingress of moisture is also caused from minute voids which are present in the external electrode layers. There is a problem that the moisture due to the ingress from the external electrode layers as described above reaches minute voids at the interfaces between the internal electrode layers and the ceramic layers which are present in the ceramic laminate, thereby causing a decrease in insulation resistance.

Therefore, for example, Japanese Patent Application Laid-Open No. 2001-102247 (hereinafter, referred to as Japanese Patent Application Laid-Open No. 2001-102247) proposes the structure of a chip-type electronic component for solving the problem described above. The chip-type electronic component proposed in Japanese Patent Application Laid-Open No. 2001-102247 has a thick-film base conductor layer and an external terminal electrode of a surface plating layer which are formed on both ends of a rectangular ceramic substrate, and in the chip-type electronic component, the external terminal electrodes are impregnated with a water repellent member. This impregnation suppresses the ingress of moisture into a porous section of the external terminal electrodes even when the chip-type electronic component is left as it is in a humid place. As a result, moisture is prevented from reaching the electronic component body through the surface plating layer and the thick-film base conductor layer.

In addition, for example, Japanese Patent Application Laid-Open No. 2-301113 (hereinafter, referred to as Japanese Patent Application Laid-Open No. 2-301113) proposes the structure of a laminated ceramic electronic component for solving the problem described above, and a method for producing the laminated ceramic electronic component. In the laminated ceramic electronic component proposed in Japanese Patent Application Laid-Open No. 2-301113, defects such as gaps, bores and pinholes in a ceramic laminate or in external electrodes are filled with an inorganic oxide. In addition, the method for producing the laminated ceramic electronic component proposed in Japanese Patent Application Laid-Open No. 2-301113, includes: forming a ceramic laminate or external electrodes on a ceramic laminate; then immersing the ceramic laminate in an organic metal solution such as a metal alkoxide to impregnate defects such as gaps, bores, and pinholes in the ceramic laminate or in the external electrodes with the organic metal; and then decomposing the organic metal into an inorganic oxide by heating. The implementation of this method suppresses ingress of moisture into the gaps or bores described above.

In the structure of the chip-type electronic component described in Japanese Patent Application Laid-Open No. 2001-102247, the external terminal electrodes have the water repellent material remaining. For this reason, in the case of forming a plating layer in a subsequent step, the surfaces of the external terminal electrodes are likely to have a defect caused in plating deposition, and in the case of mounting the chip-type electronic component onto a substrate or the like by soldering, a defect may be caused.

In addition, the structure of the chip-type electronic component described in Japanese Patent Application Laid-Open No. 2001-102247 fails to achieve the effect of suppressing the ingress of moisture into the electronic component body in the case of a small amount of water repellent material remaining in the external terminal electrodes, or has a defect caused in plating deposition in the case of a large amount of water repellent material remaining in the external terminal electrodes. For this reason, it is difficult to control the treatment condition for impregnating the external terminal electrodes with the water repellent member.

On the other hand, in Japanese Patent Application Laid-Open No. 2-301113, the ceramic laminate is immersed in the organic metal solution such as a metal alkoxide to fill defects such as gaps in the ceramic laminate or in the external electrodes with an inorganic oxide. However, this method is not able to fill even nano-level minute voids with the inorganic oxide, and thus produces an insufficient effect of suppressing the ingress of moisture into the voids.

SUMMARY OF THE INVENTION

Therefore, an object of the present invention is to provide a method for producing a ceramic body, which is capable of preventing the ingress of moisture into a void between a conductor and the ceramic body more effectively in the ceramic body including the conductor therein.

The method for producing a ceramic body in accordance with the present invention is a method for producing a ceramic body including a conductor therein, which includes the following steps:

(a) a step of causing ingress of a supercritical fluid containing an oxide sol precursor into a void between the conductor and the ceramic body; and (b) a step of turning the oxide sol into a gel and applying a heat treatment, thereby filling the void between the conductor and the ceramic body with an oxide.

The supercritical fluid for use in the method for producing a ceramic body according to the present invention has a high solubility as in the case of liquids, and the oxide sol precursor can be thus dissolved in the supercritical fluid. In addition, the supercritical fluid has a high diffusion coefficient as in the case of gases, which is superior in permeability, and the supercritical fluid with the oxide sol precursor dissolved therein can thus achieve ingress even into nano-level minute voids.

Thus, in the step of causing ingress of the supercritical fluid containing the oxide sol precursor into the void between the conductor and the ceramic body, the supercritical fluid with the oxide sol precursor dissolved therein can achieve ingress even into nano-level minute voids present between the conductor and the ceramic body. Furthermore, in the step of turning the oxide sol into a gel and applying a heat treatment, thereby filling the void between the conductor and the ceramic body with the oxide, nano-level minute voids present between the conductor and the ceramic body can be even filled with the oxide.

Accordingly, the ceramic body including the conductor therein allows the ingress of moisture into the void between the conductor and the ceramic body to be prevented more effectively.

In the method for producing a ceramic body according to the present invention, the supercritical fluid is preferably carbon dioxide in a supercritical state.

Carbon dioxide has a critical temperature of 31.1° C. and a critical pressure of 7.38 Mpa, which is brought into a supercritical state at the critical temperature or more and at the critical pressure or more. For this reason, carbon dioxide can be brought into a supercritical state under relatively mild conditions. In addition, since carbon dioxide in a supercritical state is not toxic, and is chemically inactive, high-purity carbon dioxide in a supercritical state is available inexpensively and thus accessible. Furthermore, when carbon dioxide in a supercritical state is exposed to ordinary temperatures and pressures, the carbon dioxide is turned into carbon dioxide included in the atmosphere. For this reason, the carbon dioxide in a supercritical state, which has achieved ingress into the void between the conductor and the ceramic body, can be released into the atmosphere at ordinary temperatures and pressures, thereby removed easily.

In addition, in the method for producing a ceramic body according to the present invention, the ceramic body is preferably a ceramic laminate including a plurality of ceramic layers stacked and conductor layers interposed between the plurality of ceramic layers.

In this case, the production method according to the present invention can be applied to a method for producing a ceramic electronic component including a ceramic laminate. For example, the application of the production method according to the present invention fills even nano-level minute voids present between a conductor and a ceramic body with an oxide before the formation of external electrode layers in an electronic component including a ceramic laminate, thereby allowing the ingress of moisture into a void between the conductor and the ceramic body to be prevented more effectively. Therefore, substances which block plating deposition never remain on the surfaces of the external electrode layers. Thus, in the case of forming a plating layer in a subsequent step, the surfaces of the external terminal electrodes have no defect caused in plating deposition, and in the case of mounting the chip-type electronic component onto a substrate or the like by soldering, no defect is caused either.

Furthermore, when the interface between the conductor layer and the ceramic layer is exposed in the ceramic laminate, the application of the production method according to the present invention allows the ingress of moisture into the void between the conductor and the ceramic body to be prevented more effectively.

In addition, in the method for producing a ceramic body according to the present invention, the oxide gel obtained by turning the oxide sol into a gel is preferably a hydrophobic $SiO_2$ gel.

This can ensure that the ingress of moisture into the void between the conductor and the ceramic body is blocked, even when the filling oxide has a defect such as a crack caused. In this case, the void between the conductor and the ceramic body is filled with a hydrophobic $SiO_2$ gel by causing ingress of a supercritical fluid with a Si alkoxide as the oxide sol precursor dissolved therein into the void between the conductor and the ceramic body, turning the $SiO_2$ sol into a gel, and further introducing a hydrophobizing agent.

As described above, the present invention allows, in a ceramic body including a conductor therein, the ingress of moisture into the void between the conductor and the ceramic body to be prevented more effectively. Thus, for example, the application of the present invention to a method for producing a laminated ceramic electronic component such as a chip-type laminated ceramic capacitor can prevent a decrease in insulation resistance, and thus improve the reliability of the laminated ceramic electronic component.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
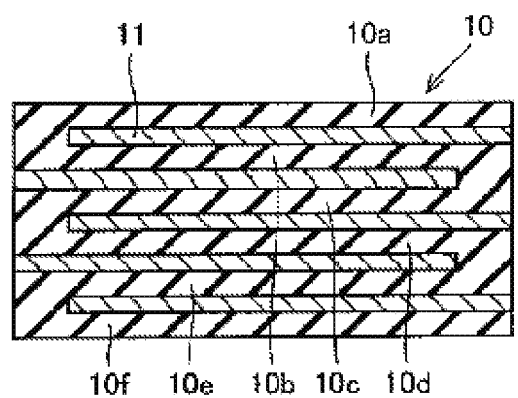
FIG. 1 is a schematic cross-sectional view illustrating a first step for producing a laminated ceramic capacitor that is an example of a ceramic body, as one preferred embodiment of the present invention.
Figure 2:
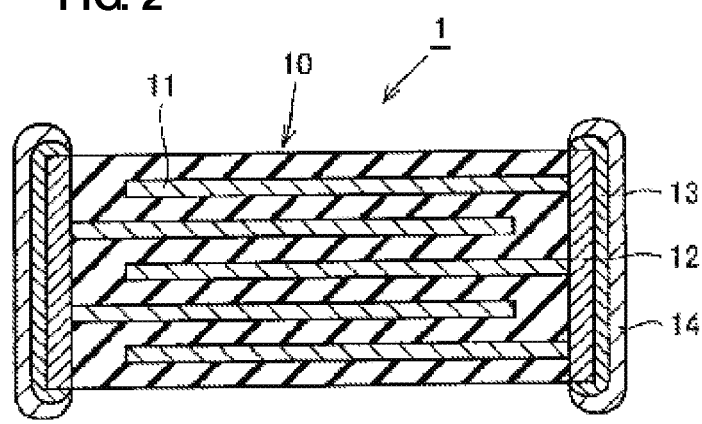
FIG. 2 is a schematic cross-sectional view illustrating a second step for producing a laminated ceramic capacitor that is an example of a ceramic body, as one preferred embodiment of the present invention.

First, a laminated ceramic capacitor will be described as an example of a ceramic body according to the present invention. FIGS. 1 and 2 are cross-sectional views illustrating steps for producing a common laminated ceramic capacitor.

First, a slurry is prepared which contains a ceramic raw material powder. This slurry is formed into sheets to prepare ceramic green sheets. A conductive paste as a raw material for internal electrode layers is applied onto surfaces of the ceramic green sheets in accordance with a predetermined pattern. This conductive paste is constituted of a metal powder, a solvent, and a varnish.

Next, the multiple ceramic green sheets with the conductive paste applied thereto are stacked, and subjected to thermocompression bonding to prepare an integrated raw laminate. As shown in FIG. 1, this raw laminate is subjected to firing to prepare a ceramic laminate 10 as a ceramic body. This ceramic laminate 10 has a plurality of internal electrode layers 11 formed therein as internal conductors. The internal electrode layers 11 have certain end surfaces exposed at the external surface of the ceramic laminate 10.

Next, as shown in FIG. 2, a conductive paste as a raw material for external electrode layers 12 is applied onto the external surface of the ceramic laminate 10 including the internal electrode layers 11 with the certain end surfaces exposed, and subjected to firing. This conductive paste is constituted of a metal powder, a glass frit, a solvent, and a varnish. Thus, external electrode layers 12 are formed on the external surface of the ceramic laminate 10, so as to be electrically connected to specific internal electrode layers 11.

Finally, in order to improve soldering performance, first and second plating layers 13, 14 are formed on the surfaces of the external electrode layers 12, if necessary.

The thus produced laminated ceramic capacitor 1 includes a ceramic laminate 10 in the shape of a rectangular parallelepiped, which contains, for example, a $BaTiO_3$ based compound. The ceramic laminate 10 includes a plurality of (in the figure, six as an example) stacked ceramic layers 10a, 10b, 10c, 10d, 10e, 10f, and a plurality of (in the figure, five as an example) internal electrode layers 11 formed along the interfaces between the plurality of ceramic layers 10a, 10b, 10c, 10d, 10e, 10f. The internal electrode layers 11 are formed so as to reach the external surface of the ceramic laminate 10. The internal electrode layers 11 extracted to one end surface of the ceramic laminate 10 and the internal electrode layers 11 extracted to the other end surface thereof are arranged alternately so that capacitance can be acquired with the dielectric ceramic layers interposed in the ceramic laminate 10. It is to be noted that the conductive material for the internal electrode layers 11 is preferably nickel or a nickel alloy in terms of cost reduction.

In order to extract the capacitance described previously, the external electrode layers 12 are formed on the external surface of the ceramic laminate 10, and on the end surfaces, so as to be electrically connected to specific ones of the internal electrode layers 11. As the conductive material contained in the external electrode layers 12, the same conductive material as in the case of the internal electrode layers 11 can be used, and furthermore, silver, palladium, a silver-palladium alloy, etc. can be also used. The external electrode layers 12 are formed by providing and firing a conductive paste obtained by adding a glass frit to a powder of the metal or alloy. It is to be noted that while an example of thick film external electrodes has been given as the external electrode layers 12 in the description above, the external electrode layers 12 are not limited to the thick film external electrodes, and may be thin film external electrodes formed by sputtering, may be electrodes formed by plating, or may be electrodes made by other method of formation.

In addition, if necessary, a first plating layer 13 of nickel, copper, or the like is formed on the external electrode layers 12, and a second plating layer 14 of solder, tin, or the like is further formed thereon.

The method for producing a ceramic body according to the present invention is applied between the steps for producing a laminated ceramic capacitor, which are shown in FIGS. 1 and 2.

First, the method for producing a ceramic body according to the present invention causes ingress of a supercritical fluid containing an oxide sol precursor, for example, carbon dioxide in a supercritical state, into a void between the internal electrode layers 11 as the conductor and the ceramic laminate 10 as the ceramic body, as shown in FIG. 1. In this case, as the oxide, $SiO_2$, $Al_2O_3$, $TiO_2$, etc. are used, and composite oxides such as $BaTiO_3$, and glass such as $SiO_2$—$B_2O_3$—$Al_2O_3$, $SiO_2$—$Na_2O$, and $SiO_2$—$CaO$ can be also used. Specifically, the production step is carried out in a predetermined heat-resistant and pressure-resistant container or the like which is capable of holding a supercritical fluid.

Next, the oxide sol is turned into a gel, and subjected to a heat treatment, thereby filling the void between the internal electrode layers 11 and the ceramic laminate 10 with an oxide.

The supercritical fluid for use in the step described above has a high solubility as in the case of liquids, and the oxide sol precursor can be thus dissolved in the supercritical fluid. In addition, the supercritical fluid has a high diffusion coefficient as in the case of gases, which is superior in permeability, and the supercritical fluid with the oxide sol precursor dissolved therein can thus achieve ingress even into nano-level minute voids.

Thus, in the step of causing ingress of the supercritical fluid containing the oxide sol precursor into the void between the internal electrode layers 11 and the ceramic laminate 10, the supercritical fluid with the oxide sol precursor dissolved therein can achieve ingress even into nano-level minute voids present between the internal electrode layers 11 and the ceramic laminate 10. Then, the oxide sol is turned into a gel, and subjected to a heat treatment, thereby allowing even nano-level minute voids present between the internal electrode layers 11 and the ceramic laminate 10 to be filled with the oxide in the step of filling the void between the internal electrode layers 11 and the ceramic laminate 10 with the oxide. It is to be noted that the supercritical fluid may be removed after turning the oxide sol into a gel.

Accordingly, the laminated ceramic capacitor 1, as an example of the ceramic body including the conductor therein, allows the ingress of moisture into the void between the internal electrode layers 11 and the ceramic laminate 10 to be prevented more effectively.

It is to be noted that examples of the ceramic body including the conductor therein, which are not limited to laminated ceramic capacitors, can include laminated chip inductors, laminated piezoelectric elements, multilayer ceramic substrates, and laminated chip thermistors.

As described above, in the method for producing a ceramic body according to the present invention, the supercritical fluid is preferably carbon dioxide in a supercritical state.

Carbon dioxide has a critical temperature of 31.1° C. and a critical pressure of 7.38 Mpa, which is brought into a supercritical state at the critical temperature or more and at the critical pressure or more. For this reason, carbon dioxide can be brought into a supercritical state under relatively mild conditions. In addition, since carbon dioxide in a supercritical state is not toxic, and is chemically inactive, high-purity carbon dioxide in a supercritical state is available inexpensively and thus accessible. Furthermore, when carbon dioxide in a supercritical state is exposed to ordinary temperatures and pressures, the carbon dioxide is turned into carbon dioxide included in the atmosphere. For this reason, the carbon dioxide in a supercritical state, which has achieved ingress into the void between the internal electrode layers 11 and the ceramic laminate 10, can be released into the atmosphere at ordinary temperatures and pressures, thereby removed easily.

In addition, in the method for producing a ceramic body according to the present invention, as described above, the ceramic body is preferably a ceramic laminate 10 including a plurality of stacked ceramic layers 10a, 10b, 10c, 10d, 10e, 10f and a plurality of internal electrode layers 11 as conductor layers interposed between the plurality of ceramic layers 10a, 10b, 10c, 10d, 10e, 10f.

In this case, the production method according to the present invention can be applied to a method for producing a ceramic electronic component including the ceramic laminate 10, as an example, the laminated ceramic capacitor 1. For example, the application of the production method according to the present invention fills even nano-level minute voids present between the internal electrode layers 11 and the ceramic laminate 10 with an oxide before the formation of the external electrode layers 12 in the laminated ceramic capacitor 1 as the electronic component including the ceramic laminate 10, thereby allowing the ingress of moisture into the void between the internal electrode layers 11 and the ceramic laminate 10 to be prevented more effectively. Therefore, substances which block plating deposition never remain on the surfaces of the external electrode layers 12. Thus, in the case of forming the first and second plating layers 13, 14 as plating layers in a subsequent step, the surfaces of the external terminal electrodes have no defect caused in plating deposition, and in the case of mounting the chip-type electronic component onto a substrate or the like by soldering, no defect is caused either.

Furthermore, when the ceramic laminate 10 has interfaces exposed between the internal electrode layers 11 as conductor layers and the ceramic layers 10a, 10b, 10c, 10d, 10e, 10f as shown in FIG. 1, the application of the production method according to the present invention allows the ingress of moisture into the void between the internal electrode layers 11 and the ceramic laminate 10 to be prevented more effectively.

In addition, in the method for producing a ceramic body according to the present invention, the oxide gel obtained by turning the oxide sol into a gel is preferably a hydrophobic $SiO_2$ gel.

This can ensure that the ingress of moisture into the void between the conductor and the ceramic body is blocked, even when the filling oxide has a defect such as a crack caused. In this case, the void between the conductor and the ceramic body is filled with a hydrophobic $SiO_2$ gel by causing ingress of a supercritical fluid with an Si alkoxide as the oxide sol precursor dissolved therein into the void between the conductor and the ceramic body, turning the $SiO_2$ sol into a gel, and further introducing a hydrophobizing agent.

It is to be noted that methods for providing a $SiO_2$ gel with hydrophobicity include, for example, a method in which after filling with a $SiO_2$ gel, a hydrophobizing agent is introduced with the supercritical state kept. The hydrophobizing agent reacts with a hydroxyl group remaining in the $SiO_2$ gel. This reaction can introduce a hydrophobic group.

The hydrophobizing agent has a functional group reacting with a silanol group and a hydrophobic group, which can include organic silane compounds such as (hexamethyldisilazane, hexamethyldisiloxane, and trimethylmethoxysilane), and fluoroalkyl silane compounds such as (fluorooctylethyltrimethoxysilane, fluorooctylethyltrichlorosilane, and fluorooctylethylmethyldimethoxysilane).

EXAMPLE

As shown in FIG. 1, 100 samples of fired ceramic laminates 10 (dimensions: 1.0 mm×0.5 mm×0.5 mm) for laminated ceramic capacitors 1 were prepared in which internal electrode layers 11 of nickel were exposed alternately at both end surfaces. These ceramic laminates 10, and tetraethoxy silane (TEOS) as a precursor for a silica ($SiO_2$) sol, ethanol, and water mixed at a ratio by mass of 1:1:1.25 were put into a 5 ml heat-resistant and pressure-resistant container. Then, a carbon dioxide gas was introduced into the heat-resistant and pressure-resistant container, and the temperature and pressure in the heat-resistant and pressure-resistant container were increased to bring the carbon dioxide into a supercritical state and keep the temperature and pressure in the heat-resistant and pressure-resistant container 80° C. and 25 MPa for 120 minutes. The precursor for a silica sol was dissolved into the carbon dioxide in the supercritical state in this way, and the silica sol was then turned into a gel.

After that, the carbon dioxide evaporated by returning the inside of the heat-resistant and pressure-resistant container to ordinary temperatures and pressures was removed by discharge to the outside of the heat-resistant and pressure-resistant container. The ceramic laminates 10 were taken out from the heat-resistant and pressure-resistant container with the carbon dioxide removed therefrom. The ceramic laminates 10 taken out were dried by keeping the ceramic laminates 10 in an oven at a temperature of 40° C. for 24 hours. This drying removed moisture from the silica gel.

Next, as shown in FIG. 2, a copper (Cu) paste was applied by a dip method as a conductive paste of a raw material for external electrode layers 12 onto the external surfaces of the ceramic laminates 10 including the internal electrode layers 11 with the certain end surfaces exposed, and then subjected to firing at a temperature of 800° C. This conductive paste is constituted of a metal powder, a glass frit, a solvent, and a varnish. Thus, external electrode layers 12 were formed on the external surfaces of the ceramic laminates 10, so as to be electrically connected to specific internal electrode layers 11. In this step, the silica gel was turned into silica ($SiO_2$) as an inorganic oxide.

Finally, in order to improve soldering performance, a nickel (Ni) plating layer as a first plating layer 13 and a tin (Sn) plating layer as a second plating layer 14 were formed sequentially by an electric field plating method on the surfaces of the external electrode layers 12. In this way, the laminated ceramic capacitors 1 were prepared.

It is to be noted that the example described above requires no additional heat treatment step, because the silica sol is turned into silica ($SiO_2$) as an inorganic oxide through the heat treatment in the firing step for forming the external electrode layers 12.

The observation of cross sections of the obtained laminated ceramic capacitors 1 by a scanning electron microscope (SEM) confirmed that voids between the internal electrode layers 11 and the ceramic laminates 10, that is, minute voids present at the interfaces between the internal electrode layers 11 and the ceramic layers 10a, 10b, 10c, 10d, 10e, 10f were filled with silica.

Thus, it is expected that the lifetime characteristics are improved in a moisture resistance loading test for the laminated ceramic capacitors 1.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for producing a ceramic body including a conductor therein, the method comprising the steps of:
   causing ingress of a supercritical fluid containing a precursor including an oxide sol into a void between the conductor and the ceramic body; and
   turning the oxide sol into a gel and applying a heat treatment, thereby filling the void between the conductor and the ceramic body with an oxide of the oxide sol.

2. The method for producing a ceramic body according to claim 1, wherein the supercritical fluid is carbon dioxide in a supercritical state.

3. The method for producing a ceramic body according to claim 1, wherein the ceramic body is a ceramic laminate including a plurality of ceramic layers stacked and conductor layers interposed between the plurality of ceramic layers.

4. The method for producing a ceramic body according to claim 3, wherein the ceramic laminate has interfaces exposed between the conductor layers and the ceramic layers.

5. The method for producing a ceramic body according to claim 1, wherein the gel obtained by turning the oxide sol into a gel is a hydrophobic $SiO_2$ gel.

* * * * *